(12) United States Patent
Moqanaki et al.

(10) Patent No.: US 10,331,012 B2
(45) Date of Patent: Jun. 25, 2019

(54) APPARATUS FOR GENERATING NARROW-BAND SINGLE-PHOTON AND MULTI-PHOTON STATES WITH LONG COHERENCE LENGTH

(71) Applicant: Universitaet Wien, Vienna (AT)

(72) Inventors: Amir Moqanaki, Vienna (AT); Francesco Massa, Vienna (AT); Philip Walther, Vienna (AT)

(73) Assignee: Universität Wien, Vienna (AT)

( * ) Notice: Subject to any disclaimer, the term of this patent is extended or adjusted under 35 U.S.C. 154(b) by 25 days.

(21) Appl. No.: 15/454,817

(22) Filed: Mar. 9, 2017

(65) Prior Publication Data

US 2018/0259828 A1    Sep. 13, 2018

(51) Int. Cl.
| | |
|---|---|
| *G02F 1/39* | (2006.01) |
| *G02B 17/00* | (2006.01) |
| *H01S 3/00* | (2006.01) |
| *G02F 1/37* | (2006.01) |
| *G02F 1/03* | (2006.01) |
| *G02B 27/28* | (2006.01) |

(52) U.S. Cl.
CPC .............. *G02F 1/39* (2013.01); *G02B 17/006* (2013.01); *G02B 27/283* (2013.01); *G02F 1/03* (2013.01); *G02F 1/37* (2013.01); *H01S 3/0092* (2013.01)

(58) Field of Classification Search
CPC . H01S 3/109; H01S 3/115; G02F 1/39; G02F 2001/3542
See application file for complete search history.

(56) References Cited

U.S. PATENT DOCUMENTS

| | | | | |
|---|---|---|---|---|
| 5,060,233 | A * | 10/1991 | Harder ...................... | G02F 1/37 |
| | | | | 359/328 |
| 6,982,822 | B2 | 1/2006 | Teich et al. | |
| 2007/0047600 | A1* | 3/2007 | Luo ...................... | H01S 3/0627 |
| | | | | 372/21 |

OTHER PUBLICATIONS

A. Moqanaki and P. Walther, "A Source of Single Photons Tailored to Atomic Transitions", 2015, QUPON, Vienna, Austria.
G. Rubino and A. Mqanaki, "Narrow-band Polarization Entangled Photon Pair Source Resonant to Cs Atoms", 2015, QUPON, Vienna, Austria.
G. Rubino and A. Mqanaki, "Narrow-band Polarization Entangled Photon Pair Source Resonant to Cs Atoms", PICQUE Meeting, Jul. 2015, Rome, Italy.
A. Moqanaki, "A Mode-filter-free Source of Narrow-band Photon-pairs", DPG Tagung, Mar. 20, 2014, Berlin, Germany.

* cited by examiner

*Primary Examiner* — Thanh Luu
(74) *Attorney, Agent, or Firm* — 24IP Law Group USA, PLLC; Timothy DeWitt

(57) ABSTRACT

An apparatus for generating narrow-band single and multi-photon state with long coherence length is disclosed. The apparatus comprises a laser pump (20) producing laser light, a non-linear optical crystal (30) within an optical cavity (40), wherein the optical cavity (40) comprises at least two mirrors (42, 44); and a tuning crystal (50) situated between the non-linear optical crystal (30) and a first one (42) of the at least two mirrors.

9 Claims, 3 Drawing Sheets

APPARATUS FOR GENERATING NARROW-BAND SINGLE-PHOTON AND MULTI-PHOTON STATES WITH LONG COHERENCE LENGTH

CROSS-RELATION TO OTHER APPLICATIONS

None

BACKGROUND OF THE INVENTION

Field of the Invention

The invention relates to an apparatus for the generation of single-photon and multi-photon states using cavity-enhanced spontaneous parametric down conversion.

Brief Description of the Related Art

Spontaneous parametric down-conversion (also known as SPDC, parametric fluorescence, or parametric scattering) is a process known in quantum optics, which is used as a source of entangled photon pairs and of single photons.

The basic process involves a nonlinear crystal, that is used to split an incoming photon beam, termed a "pump beam", into pairs of photons, called "signal" and "idler" photons. In uniform non-linear crystals, the process can happen with non-negligible efficiency only if the amplitudes of the photons in the pump beam as well as the amplitudes of the signal photons and the idler photons are in phase with each other, while the signal photons and the idler photons travel through the non-linear crystal. This condition is called "phase-matching" and corresponds to the conservation of the momentum between the pump beam, as well as the signal photons and the idler photons. According to the law of conservation of energy, the combined energies of the signal photons and the idler photons are equal to the energy of the original incoming photon in the pump beam. Therefore, the emitted photons (signal and idler photons) are correlated in frequency. The state of the non-linear crystal remains unchanged by the process of splitting the incoming photon beam.

The pairs of the signal and idler photons have correlated polarizations: if the two polarizations are identical (but orthogonal to the polarization of the pump beam) then the process is called type I. If the two polarizations are orthogonal (termed H and V for horizontal and vertical polarizations), then the process is termed type II.

Spontaneous parametric down conversion (SPDC) is used as a source of photon pairs and is triggered by random vacuum fluctuations. The photon pairs are created at random times. The conversion efficiency of SPDC is very low, on the order of 1 pair per every $10^{12}$ incoming photons. However, if one of the pair of photons (i.e. the "signal photon") is detected at any time then its partner (the "idler photon") is known to be present.

Efficient SPDC at the desired wavelengths can be obtained by quasi-phase-matching. The quasi phase matching technique is one that enables SPDC emission in a broad range of wavelengths. This technique comprises allowing a phase mismatch between the pump, signal and idler photons over a certain propagation distance but periodically reversing the non-linear interaction at the points where the phase mismatch would start creating destructive effects. The conservation of momentum is ensured by an additional momentum contribution corresponding to the wave vector of the periodic poling structure. This leads to a phase-matching condition which takes into account also the period of the quasi-phase-matching structure. The most used method for quasi-phase-matching is periodic poling, that is the periodic inversion of the domain orientation in a non-linear crystal, so that the sign of the non-linear coefficient also changes.

The typical frequency bandwidth of the signal photons and the idler photons emitted via SPDC is of the order of 100 GHz-1 THz. Reducing the bandwidth to MHz-level by optical filtering implies a reduction of the photon signal of 5-6 orders of magnitude.

Cavity-enhanced spontaneous parametric down conversion (CESPDC) is a more efficient method of creating narrow-bandwidth photon pairs in which the nonlinear crystal is placed within an optical resonant cavity [see Ou, Lu-PRL83, 2556-1999].

One example of the generation of a pair of entangled photons using parametric processes in a cavity is taught in U.S. Pat. No. 6,982,822 (Teich et al). A BBO (barium borate) crystal used the non-linear crystal in a non-linear configuration.

One of the main challenges in designing an apparatus for CESPDC is single-mode operation. The SPDC bandwidth is usually far larger than the free spectral range (FSR) of the cavity used. There may therefore be many resonant modes in the cavity present at the same time. One way of solving this issue is to use additional external etalons or atomic line filters to filter out the redundant resonant modes. This solution reduces the brightness, adds to bulkiness and complicates the operation of the apparatus.

SUMMARY OF THE INVENTION

An apparatus for CESPDC is disclosed in which an additional tuning crystal is incorporated into the apparatus. The apparatus comprises a laser pump producing laser light, a non-linear optical crystal within an optical cavity, wherein the optical cavity comprises at least two mirrors and the additional tuning crystal situated between the non-linear optical crystal and a first one of the at least two mirrors. The non-linear optical crystal is adapted to generate single photons in entangled or separable states from the laser light.

The apparatus generates narrow-band single-photon and multi-photon states with long coherence length. In this context, the term "coherence" implies that the single-photon or multi-photon states have a fixed phase relationship. The term "coherence length" is used for quantifying the degree of temporal coherence between the single-photon or multi-photon states and is the propagation length over which the coherence between the photon states degrades significantly. Thus a "long coherence length" implies that the single-photon or multi-photon states are coherent over a long propagation length. The term "narrow-band" means that the bandwidth is in the region of MHz compared to typical prior art sources with a bandwidth in the region of 100 GHz to several THz. The bandwidth is proportional to the coherence length and thus the coherence length in the prior are sources will be in the millimeter range, whereas the apparatus has a coherent length of around 10 m (hence the term "long coherence").

In one further aspect of the invention, the apparatus comprises a crystal element for generating a second harmonic of the laser light from the laser pump and using the second harmonic as incoming laser light for the non-linear optical crystal.

The apparatus has a polarization beam splitter (PBS) at an output of the optical cavity and the polarization beam splitter has two outputs. There is furthermore a beam splitter (BS) at the two outputs of the polarization beam splitter.

BRIEF DESCRIPTION OF THE FIGURES

For a more complete understanding of the present invention and the advantages thereof, reference is now made to the following description and the accompanying drawings, in which.

DETAILED DESCRIPTION OF THE INVENTION

Figure 1:
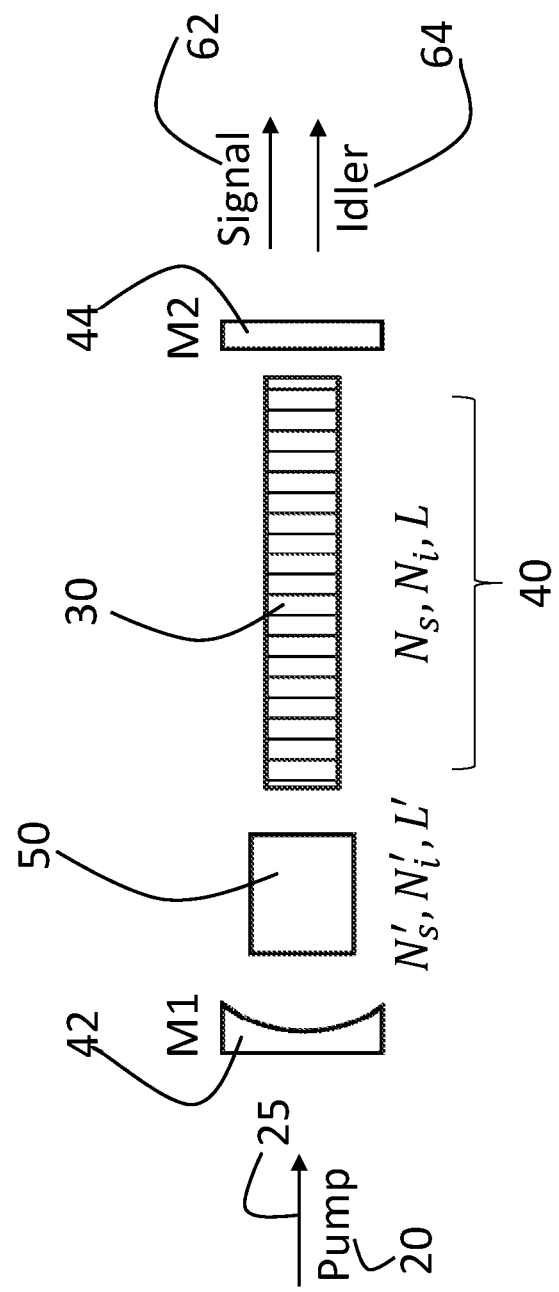
FIG. 1 shows a simplified design of the apparatus of this disclosure.

FIG. 1 shows an overview of the apparatus 10 of this disclosure. The apparatus 10 comprises a pump 20 which produces a flux of photons 25. A laser is used as the pump 20. A non-linear (SPDC) crystal 30 is positioned within an optical cavity 40 formed from two mirrors 42 and 44. A tuning crystal 50 has a length L and is positioned between the non-linear crystal 30 and a first mirror 42 of the optical cavity 40.

The tuning crystal 50 is a birefringence crystal with a length L', which is calculated as set out below. In one aspect of the invention, a Pockels cell can be used. In principle, the tuning crystal can be a simple birefringent material without any electric tuning of the birefringence. The disadvantage in this latter case is that it is not possible to finely tune the properties of the optical cavity 40 and consequently dynamically adapt the mode selection scheme (described below). The choice of the material depends on the requirements of the pump 20.

The non-linear crystal 50 can be any non-linear crystal phase-matched for collinear emission. This includes, but is not limited to, in case of critical phase-matching BBO, LBO and BiBO and in case of quasi-phase-matching lithium niobate, lithium tantalite and potassium titanyl phosphate (KTP) $KTiOPO_3$. The different types of the non-linear crystals have different efficiencies and different optimal wavelengths at which the non-linear crystals can be operated. The KTP is normally used for pump wavelengths in the visible and near-infra-red range (approximately from 350 to about 2000 nm). The same classes of wavelength (visible and near infra-red) are for lithium niobate, which is more used for type I processes since for these type I processes, the lithium niobate has a higher non-linear coefficient. The maximum pump power for lithium niobate at which it is used should be lower. BBO also can be pumped in the same range of wavelength as the KTP and maybe even broader (lower in the UV and higher in the NIR).

A pair of photons comprising a signal photon 62 and an idler photon 64 emerge from the second mirror 44 of the optical cavity 40 and can be used for numerous applications, as set out below.

Figure 2:
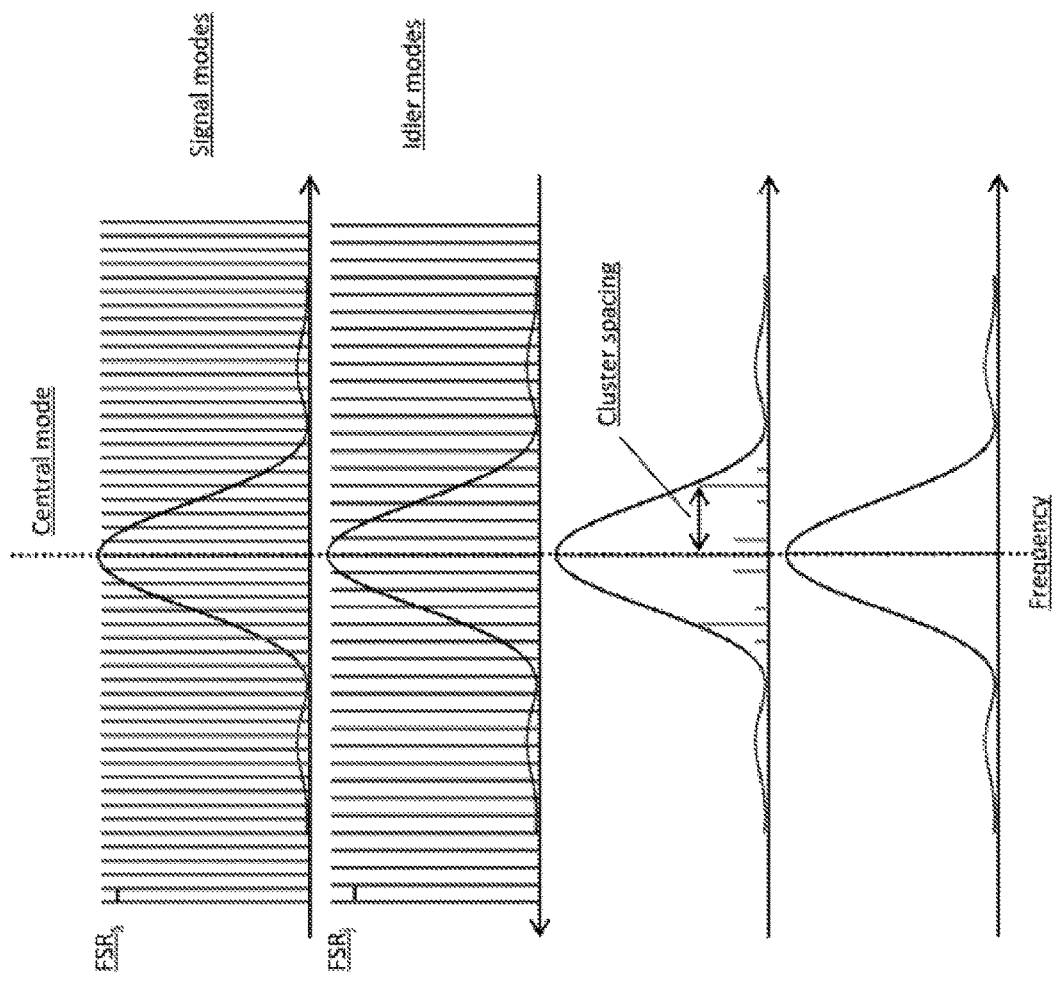
FIGS. 2A-2D illustrate the single-longitudinal-mode selection

FIGS. 2A-2D illustrate the resonance conditions for SPDC in the optical cavity 40. It will be appreciated that the figure shown in FIG. 2 is merely schematic and the axes have arbitrary units. The SPDC spectrum is shown by the "sinc curve" (bell shape with two side lobes) in FIGS. 2A and 2B. The typical SPDC bandwidth (without the optical cavity) is relatively broad compared to the free spectral range (FSR) of the optical cavity 40, as can be seen from FIG. 2A and FIG. 2B. For example, the SPDC bandwidth for a nonlinear crystal of a few centimeters long is in the order of 100 GHz. Suppose therefore that the optical cavity 40 of a few centimeters long is required to accommodate that nonlinear crystal 30, then the required optical cavity 40 would have a FSR on the order of 1 GHz. This corresponds to a comb-like set of many different frequency modes present in the optical cavity 40, separated by the FSR (as shown in FIG. 2A and FIG. 2B).

If the optical cavity 40 is birefringent (i.e. containing a strong birefringent medium), each of the polarizations will experience a different refractive index. This leads to different optical paths within the optical cavity 40 and thus to different FSR for the frequency modes with the corresponding polarization. These are shown in FIG. 2A and FIG. 2B and are labeled by $FSR_s$ (for signal mode) and $FSR_i$ (for idler modes) to distinguish between the two different FSR arising from the birefringent optical cavity 40. It will be recalled the signal modes and the idler modes are orthogonally polarized.

It is therefore possible for two different sets of modes with orthogonal polarizations and also different frequency separation (FSR) to exist in the optical cavity 40 at the same time. If the optical path in the optical cavity 40 with a non-linear crystal is tuned such that the two of the modes with the orthogonal polarization are resonant at the same time, this configuration is termed "doubly resonant". It will be noted that the doubly resonant condition can happen in non-degenerate cavity enhanced SPDC systems too. The optical path difference in the optical cavity in those cavity enhanced SPDC systems is due to the frequency dependence of the group index.

If two particular modes are selected, one from each set, and the two particular modes are found to perfectly overlap, then the overlap between their neighboring modes of the two particular modes will be only partial. This partial overlap is due to the difference in the FSR in the different optical paths of each of the modes. However, after a certain number of modes N the accumulated distance between the corresponding signal and idler modes will equal the smallest FSR. At this point the N-th mode from one set perfectly overlaps again with the (N+1)-th mode from the other set.

It will be noticed that, in FIGS. 2A-D, the neighboring modes are selected from the two opposite sides of the perfectly overlapping modes, in order to consider those frequencies, which satisfy the requirements of the conservation of energy. The spectral structure of the emitted photons therefore results in clusters separated by a combined cluster spacing, as shown in FIG. 2C.

The cluster spacing can be modified by tuning the difference between the two FSRs. This is usually done by changing the temperature of the optical cavity 40, but this method of temperature change will also modify the phase-matching spectrum because of the temperature dependence of the phase-matching condition. If the cluster spacing is tuned independently of the phase-matching condition such that the cluster spacing is equal to or larger than the SPDC bandwidth, only one of the clusters survives in the optical cavity FIG. 2D.

This mechanism can be applied to any doubly-resonant cavity-enhanced SPDC system, not necessarily birefringent. For instance, the two sets of modes could be due to the fact that signal and idler photons are emitted in different spectral regions.

Each cluster can contain few resonant modes. The neighboring modes appear because of the partial overlap of the signal modes and the idler modes, as discussed above. The neighboring modes can be eliminated by increasing the finesse of the optical cavity and narrowing its bandwidth such that the difference between the two FSRs is larger than the bandwidth of the modes.

The length L' of the tuning crystal 50 is chosen such that $$\frac{1}{2}\frac{|N_S - N_i|}{|N'_s - N'_i|} \leq \frac{L'}{L} \leq \frac{|N_S - N_i|}{|N'_s - N'_i|}$$

in which $N_S$, $N_i$, $N'_s$ and $N'_i$ stand for the group indices of the signal photons 62 and the idle photons 64 at the non-linear crystal 30 and the tuning crystal 50. The group index used in optics is defined as the ordinary refractive index n plus the term f dn/df where f is the optical frequency. This choice of the length L' of the tuning crystal 50 ensures single cluster operation within the SPDC bandwidth In order to achieve a truly single mode operation, the choice of the tuning crystal 50 and the cavity finesse F has to satisfy the following condition:

$$F \geq \frac{1}{2}\frac{(FSR_i + FSR_s)}{|FSR_i - FSR_s|}$$

in which $FSR_i$ and $FSR_s$ are the free spectral range of the signal photon 62 and the idle photon 64.

This active mode selection technique by introducing the tuning crystal 50 into the resonant cavity 40 reduces the complexity of the apparatus 10 and enhances the brightness.

The apparatus 10 is therefore able to act as a source to increase the rate of detected multi-photon events in comparison to prior art methods. It is possible further to design the resonant cavity 40 to have not a very high finesse and thus increase the threshold of the resonant cavity with the non-linear crystal and use a higher power for the pump 20. The reason for this is that for the cavity with the non-linear crystal (i.e. optical parametric oscillator (OPO)). a threshold pump power is defined. The threshold pump power is the power at which the OPO goes from the regime of spontaneous emission (SPDC) to a regime of stimulated emission. In order to have single-photon states, the pump power in the OPO should be far below threshold (roughly max 10%). The threshold is determined by the amount of losses in the OPO (i.e. the higher the losses, the lower the threshold). If the cavity has a lower finesse, then the losses in the cavity are necessarily higher and so the threshold for the pump power is much lower. This allows the pumping of more energy and therefore a larger number of higher-order events.

The apparatus 10 is a narrow-bandwidth multi-photon source and has different applications in the field of photonic quantum information science. The apparatus can be used to address atomic transitions and thus realize advanced quantum computation schemes exploiting the non-linearities provided by atoms.

The apparatus 10 can be employed to interface photons with quantum memories and thus allow for the implementation of quantum communication protocols. Furthermore photons with a long coherence length are used in fundamental research in quantum physics.

EXAMPLE

Figure 3:
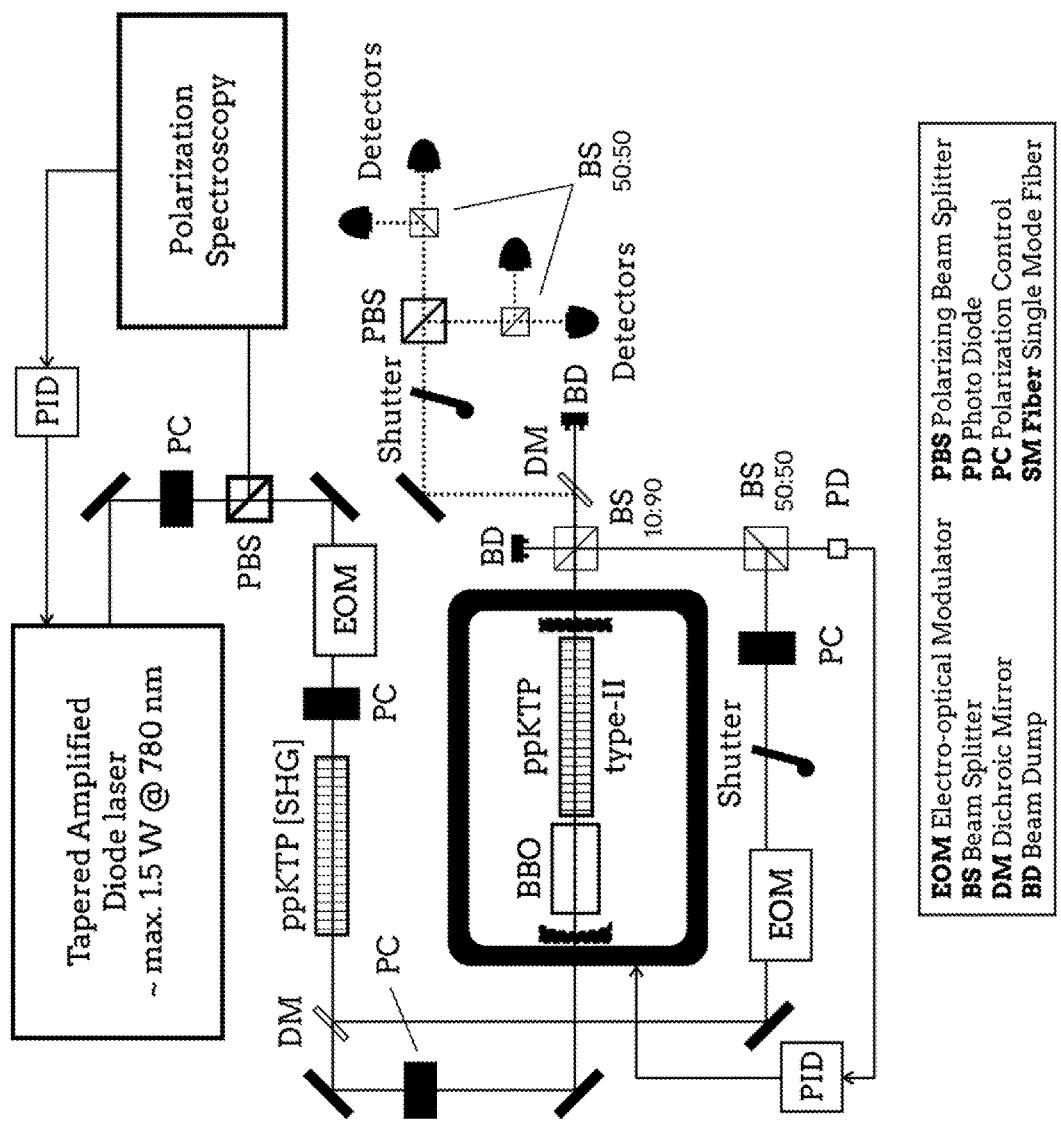
FIG. 3 shows an experimental set-up.

A non-limiting example of an experimental set-up is shown in FIG. 3. The non-linear crystal 30 used was a flux-grown periodically polled $KTiOPO_3$ from Raicol Crystals as the nonlinear medium. Quasi-phase matching for the non-linear crystal 30 is optimized for a horizontally polarized ultraviolet pump photon with a central wavelength of 390 nm that is down-converted to a near-infrared photon quadruple with 780 nm wavelength and orthogonal polarizations (type-II phase-matching). The pump, signal and idler photons are all collinear.

It is known that the SPDC state coming from the non-linear crystal 30 is not exactly a 2-photon state, but the SPDC state will have higher-order terms. These higher-order terms are all in multiples of 2 (2-photon, 4-photon, 6-photon and so on). It is also known that the weight of these higher order terms goes lower as the order goes higher (in accordance with a power law). Therefore, for any 4-photon signal, a stronger 2-photon signal will be found. Since the emission is type II and collinear, the emitted state would be a superposition of a HV term and a HHVV term in the same beam (for this purpose the higher order terms are neglected). Ordinary detectors cannot resolve the number of photons detected.

The only way to distinguish the 4-photon signal from the 2-photon signal is by using four different detectors and registering four-fold coincidences among the four different detectors. In order to register the four-fold coincidences, it is necessary to separate the photons into four different spatial modes (one special mode for each one of the detectors). We use then first a polarization beam-splitter (PBS) that spatially separates the four-photon state in two: HH and VV. After that, we place an ordinary beam-splitter (BS) on each of the two outputs of the PBS. At each beam-splitter there is 50% probability that the two photons hitting the beam splitter exit at different outputs. The probability that all the four photons exit at four different outputs is then 25%. Only in this case, is it possible to detect a four-fold coincidence. The other kind of coincidences (between two or three of the detectors) are discarded, since they could be due to the two-photon term of the emitted state.

The tuning crystal 50 was a BBO (Beta-Barium-Borate) Pockels cell from Castech Crystals. The pump 20 was formed from a tapered amplified diode laser (Toptica TA pro 780) at 780 nm whose frequency is stabilized to Rb D2 line by polarization spectroscopy. This laser is used to pump a PPKTP crystal for second-harmonic generation (SHG), which provides the pump beam at 390 nm for the source.

In the future, it is planned to insert an electro-optical modulator (EOM) to shape the spectral structure of the pump beam and thus optimize the four-photon emission and at the same time switch between the generation of pure and frequency-entangled states. It is further planned to lock the optical cavity 40 to the Toptica TA pro laser by using the Pound-Drever-Hall technique. Currently this technique is not implemented and the near-infrared beam transmitted by the optical cavity 40 is sampled to perform the lock.

The PID controller used to lock the optical cavity 40 is from Toptica. Homebuilt shutters are used to switch between the phase in which the optical cavity is locked (lasting around 100 ms) and the phase in which the photons are counted (around 800 ms). The shutters are controlled by an Arduino board.

The cavity mirrors 42 and 44 are from Layertech and the apparatus 10 is stabilized in temperature by a homebuilt oven employing a temperature controller from Wavelength Electronics, a Peltier element from Kryotherm and a thermistor from Epcos.

The detectors for photon counting are avalanche photodiodes (APDs) from Excelitas. The other optical elements (mirrors, lenses, beam-splitters, photodiodes . . . ) and the related mounts are from Thorlabs or Newport. The whole set-up lies on a Newport optical table.

The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments as are suited to the particular use contemplated. It is intended that the scope of the invention be defined by the claims appended hereto, and their equivalents. The entirety of each of the aforementioned documents is incorporated by reference herein.

REFERENCE NUMERALS

10 Apparatus
20 Pump
30 Non-linear crystal
40 Optical cavity
42 First mirror
44 Second mirror
50 Tuning crystal
62 Signal photon
64 Idle photon

What is claimed is:

1. Apparatus for generating narrow-band single-photon and multi-photon states, the apparatus comprising:
    a laser pump producing laser light;
    a non-linear optical crystal within an optical cavity, wherein the non-linear optical crystal is adapted to receive the laser light and produce the photons using spontaneous parametric down conversion and wherein the optical cavity comprises at least two mirrors, the non-linear optical crystal being located between the at least two mirrors; and
    a birefringent tuning crystal situated in the optical cavity between the non-linear optical crystal and a first one of the at least two mirrors, wherein the birefringent tuning crystal has adjustable optical paths for producing resonant frequencies of the single-photon and multiphoton states in the optical cavity and enabling clustering.

2. The apparatus of claim 1, wherein the non-linear optical crystal is adapted to generate entangled ones of the photons from the laser light.

3. The apparatus of claim 1, further comprising a crystal element for generating a second harmonic of the laser light from the laser pump and using the second harmonic as incoming laser light for the non-linear optical crystal.

4. The apparatus of claim 1, wherein the non-linear optical crystal is one of $KTiOPO_3$, BBO, LBO, BiBO, lithium niobate or lithium tantalate.

5. The apparatus of claim 1, wherein the tuning crystal is a Pockels cell.

6. The apparatus of claim 5, wherein the tuning crystal is made of BBO.

7. The apparatus of claim 1, further comprising a polarization beam splitter (PBS) at an output of the optical cavity, wherein the polarization beam splitter has two outputs.

8. The apparatus of claim 7, further comprising a beam splitter (BS) at the two outputs of the polarization beam splitter.

9. The apparatus of claim 1, further comprising a plurality of detectors for detecting the photons.

* * * * *